(12) United States Patent
Chao (10) Patent No.: US 10,686,459 B2
(45) Date of Patent: Jun. 16, 2020

(54) PROGRAMMABLE GAIN AMPLIFIER (PGA) EMBEDDED PIPELINED ANALOG TO DIGITAL CONVERTERS (ADC) FOR WIDE INPUT FULL SCALE RANGE

(71) Applicant: IPGREAT INCORPORATED, Grand Cayman (KY)

(72) Inventor: Yuan-Ju Chao, Cupertino, CA (US)

(73) Assignee: IPGREAT INCORPORATED, Grand Cayman (KY)

( * ) Notice: Subject to any disclaimer, the term of this patent is extended or adjusted under 35 U.S.C. 154(b) by 0 days.

(21) Appl. No.: 16/029,610

(22) Filed: Jul. 8, 2018

(65) Prior Publication Data

US 2020/0014393 A1   Jan. 9, 2020

(51) Int. Cl.
| | | |
|---|---|---|
| *H03M 1/10* | (2006.01) | |
| *H03M 1/00* | (2006.01) | |
| *H03F 3/45* | (2006.01) | |
| *H03F 1/56* | (2006.01) | |
| *H03G 3/30* | (2006.01) | |

(52) U.S. Cl.
CPC .............. *H03M 1/002* (2013.01); *H03F 1/56* (2013.01); *H03F 3/45* (2013.01); *H03G 3/30* (2013.01); *H03M 1/1014* (2013.01); *H03F 2203/45151* (2013.01); *H03F 2203/45156* (2013.01)

(58) Field of Classification Search
CPC ........ H03M 1/002; H03M 1/1014; H03F 3/45
USPC ................. 341/155, 122, 123, 139, 120, 118
See application file for complete search history.

(56) References Cited

U.S. PATENT DOCUMENTS

| | | | | |
|---|---|---|---|---|
| 7,492,296 B1* | 2/2009 | Drakshapalli | ........... | H03M 3/35 341/122 |
| 7,768,438 B1* | 8/2010 | Cho | ....................... | H03M 1/002 341/118 |
| 8,018,361 B2* | 9/2011 | Ranganathan | ........ | H03M 1/002 341/122 |
| 8,604,962 B1* | 12/2013 | Lewyn | ................ | H03M 1/0863 341/161 |
| 2002/0027453 A1* | 3/2002 | Kulhalli | .................. | H03F 3/005 327/96 |

* cited by examiner

*Primary Examiner* — Peguy Jean Pierre
(74) *Attorney, Agent, or Firm* — Patent Law Office, P.C.; Bao Tran (57) ABSTRACT

A method of incorporating Programmable Gain Amplifier (PGA) function into pipelined ADC for wide input range. The power consumption is saved without adding extra stage to reduce input range. The ADC input range can be adjusted on the fly using resistor bank and capacitor bank to achieve optimal system performance.

6 Claims, 12 Drawing Sheets

PROGRAMMABLE GAIN AMPLIFIER (PGA) EMBEDDED PIPELINED ANALOG TO DIGITAL CONVERTERS (ADC) FOR WIDE INPUT FULL SCALE RANGE

BACKGROUND

Figure 1:
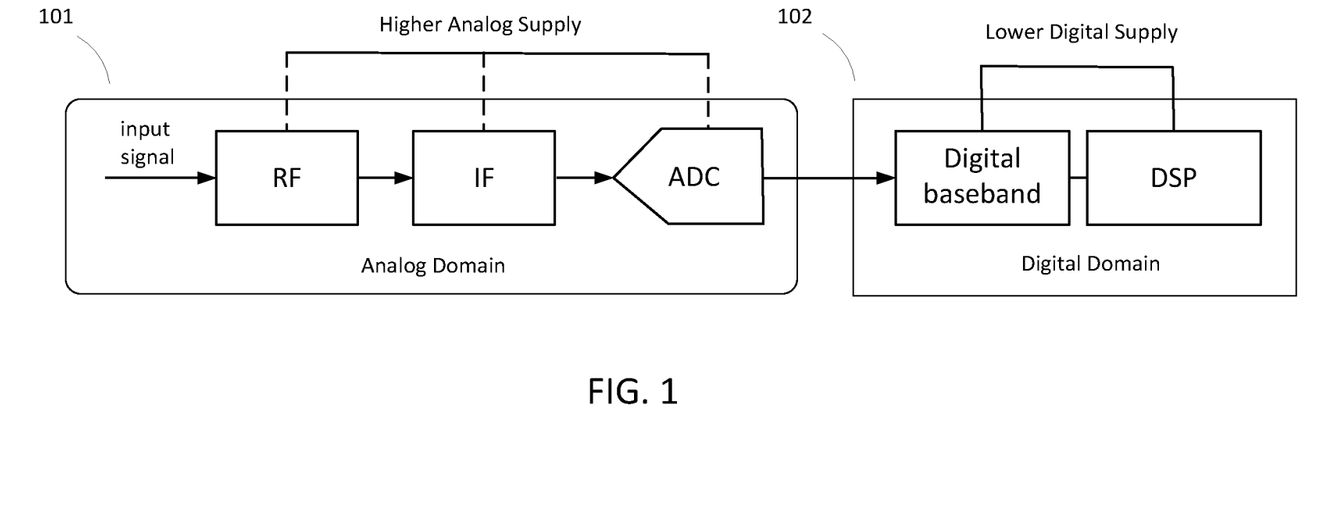
FIG. 1 illustrates a common block diagram of communication system-on-a-chip (SoC) integrated circuit.
Figure 2:
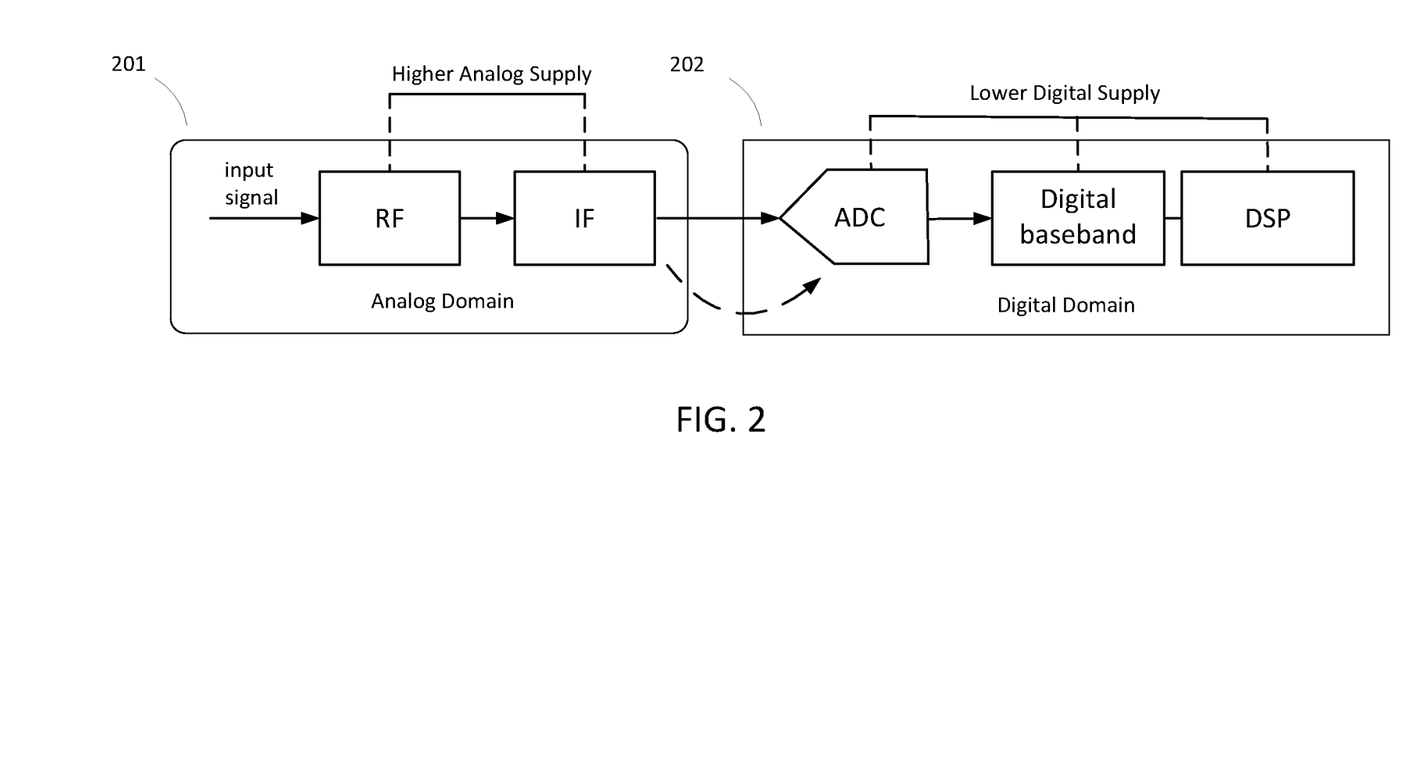
FIG. 2 shows an advantageous feature that ADC operates on a lower power supply in system-on-a-chip integrated circuit.

As the integrated circuit (IC) technology advances, the transistor device dimension is shrank and the power supply voltage is reduced. The digital circuitry benefits on the lower power consumption with the reduced supply. However the analog circuitry design is more difficult with the reduced supply since the voltage headroom is limited. In today's system-on-a-chip (SoC) integrated circuit, it consists of at least two supplies voltages; the higher analog supply is used for input/output (IO) and analog circuitry such as Radio Frequency (RF) circuit or Intermediate Frequency (IF) circuit while the lower digital supply is mainly used for digital circuitry such as digital filtering and signal processing function. FIG. 1 illustrates a common block diagram of communication system-on-a-chip (SoC) integrated circuit. Analog domain 101 consists of RF, IF and ADC while Digital domain 102 consists of digital baseband and DSP functional blocks. Analog-to-digital converter (ADC) sits in between and serves as the boundary of analog circuit domain and digital circuit domain. Conventionally analog supply is applied to ADC for achieving better performance. However, to further reduce the power consumption especially for mobile or portable applications, ADC is forced to use lower supply and is moved from analog domain into digital domain as illustrated on FIG. 2. By operating on a lower supply, ADC's input full-scale range has to be reduced. Nevertheless, Intermediate Frequency (IF) stage outputs range is not reduced to maintain decent performance metrics. In this case, the IF stage output range is greater than ADC's allowable input full-scale range.

Figure 3:
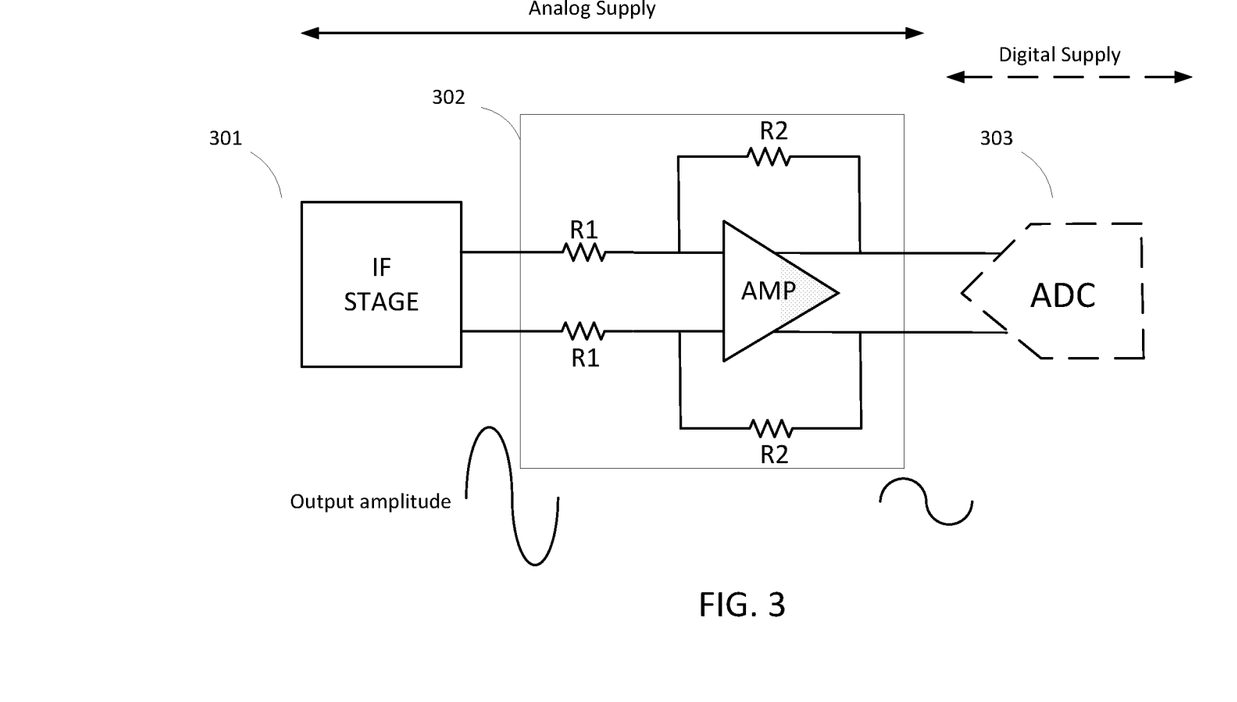
FIG. 3 illustrates a gain amplifier is inserted before ADC to reduce input range.
Figure 4:
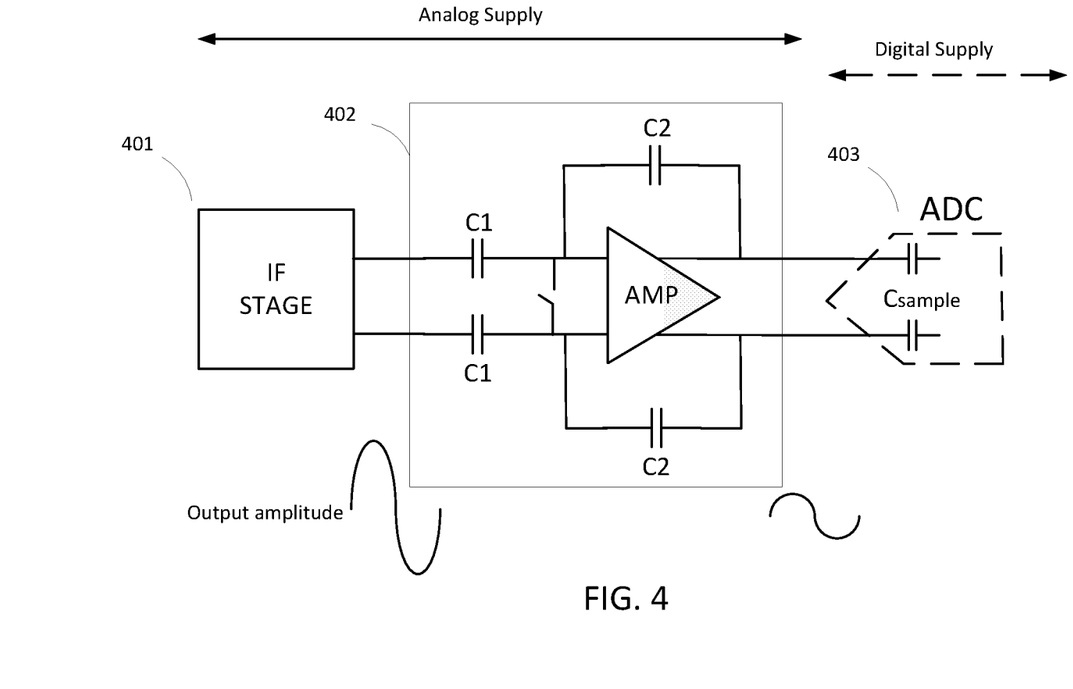
FIG. 4 illustrates a Sample and Hold (S/H) is inserted before ADC to reduce input range.

The common approach to solve this issue is adding one more stage before ADC to reduce the signal range. This extra stage can be a continuous-time type gain amplifier as illustrated on FIG. 3 or discrete-time sampled based Sample and Hold (S/H) as illustrated on FIG. 4. An inverting amplifier 302 in FIG. 3 reduces Intermediate Frequency 301 output voltage to fit ADC 303 input range. In FIG. 4, Sample and Hold 402 samples Intermediate Frequency 401 output and produces a lower output range into ADC 403. The drawback of adding a gain amplifier like 302 is the increase of noise mainly due to the resistor's R1 and R2 thermal noise. And the drawback of adding a Sample and Hold (S/H) like 402 is the degradation of linearity. Since Sample and Hold is driving the sampling capacitor Csample of pipelined ADC, obtaining a good linearity is quite challenging due to the large sampling capacitor loading. The extra power consumption of either a gain amplifier or Sample and Hold is also disadvantageous.

The presented invention solves this over range input issue and achieves good noise and linearity performance without adding extra stage and power consumption. A more complete appreciation of the present invention and its improvements can be obtained by referring to the accompanying drawings, which are briefly summarized below, to the following detailed description of illustrative embodiments of the invention, and to the appended claims.

SUMMARY

ADC has been pushed toward using lower digital supply instead of higher analog supply. Programmable Gain Amplifier (PGA) can be incorporated into pipelined ADC to avoid adding extra stage for reducing input range. Adjusting the sampling capacitor ratio and adding a gain stage before Flash ADC can decrease the input range of pipelined ADC without scarifying the performance. The input range of ADC can be programmed on the fly or fine-tuned by using adjustable gain stage and adjustable sampling capacitor ratio. The proposed invention reduces the overall power consumption and achieve optimal system performance.

DETAILED DESCRIPTION

The present invention will be described with respect to particular embodiments and with reference to certain drawings but the invention is not limited thereto but only by the claims. The drawings described are only schematic and are non-limiting.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore, it is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Similarly, it is to be noticed that the term "coupled" discloses both direct and indirect coupling and should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

Figure 5:
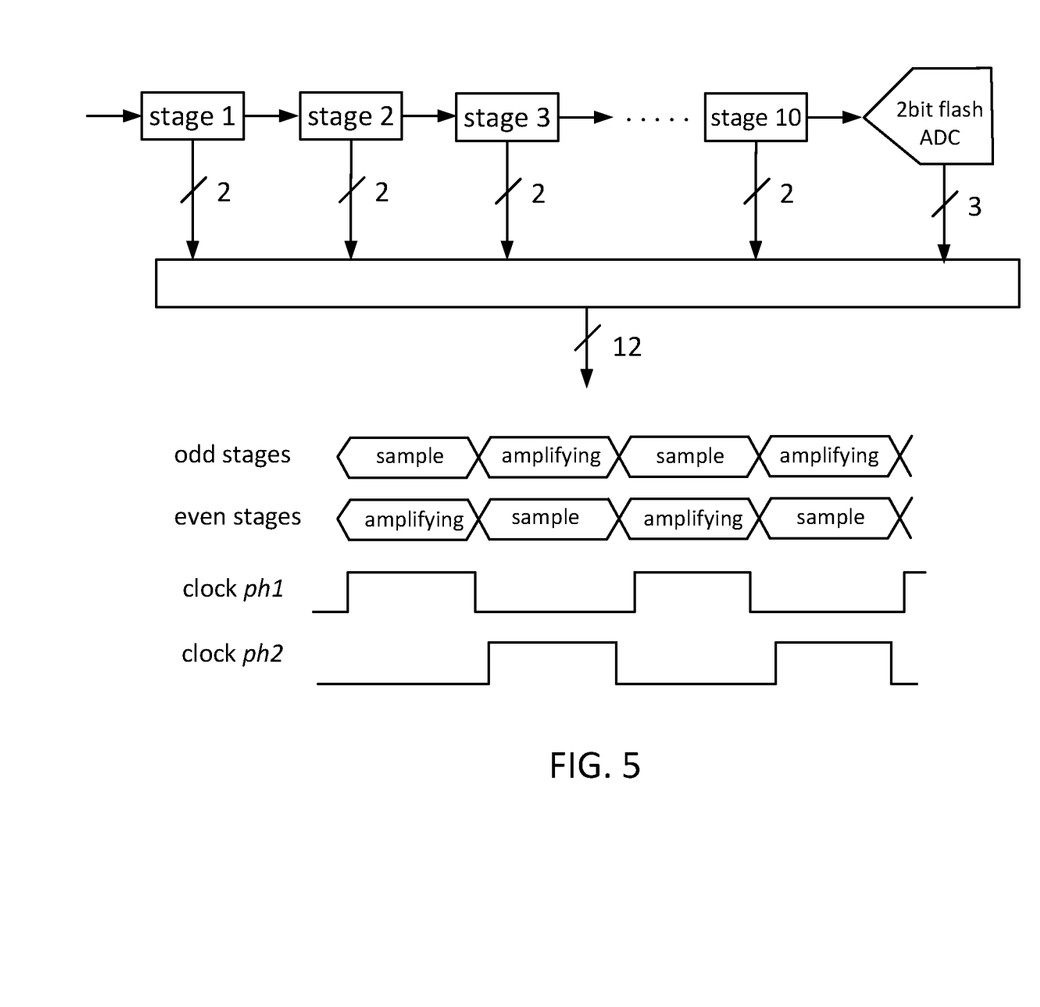
FIG. 5 illustrates an exemplary block diagram of 12-bit pipelined ADC using 1.5b/stage scheme.

FIG. 5 shows the common block diagram of 12 bit pipelined ADC using 1.5-bit/stage scheme. There are 11 stages pipelined and each stage generates two bits into digital error correction. Digital error correction combines all the bits together then aligns the timing and finally resolves 12 bit outputs. Odd stages and even stages are operating at different clock phases ph1 and ph2; when odd stages are performing sampling function the even stages are performing amplification then they are alternated on the next clock phase.

Figure 6:
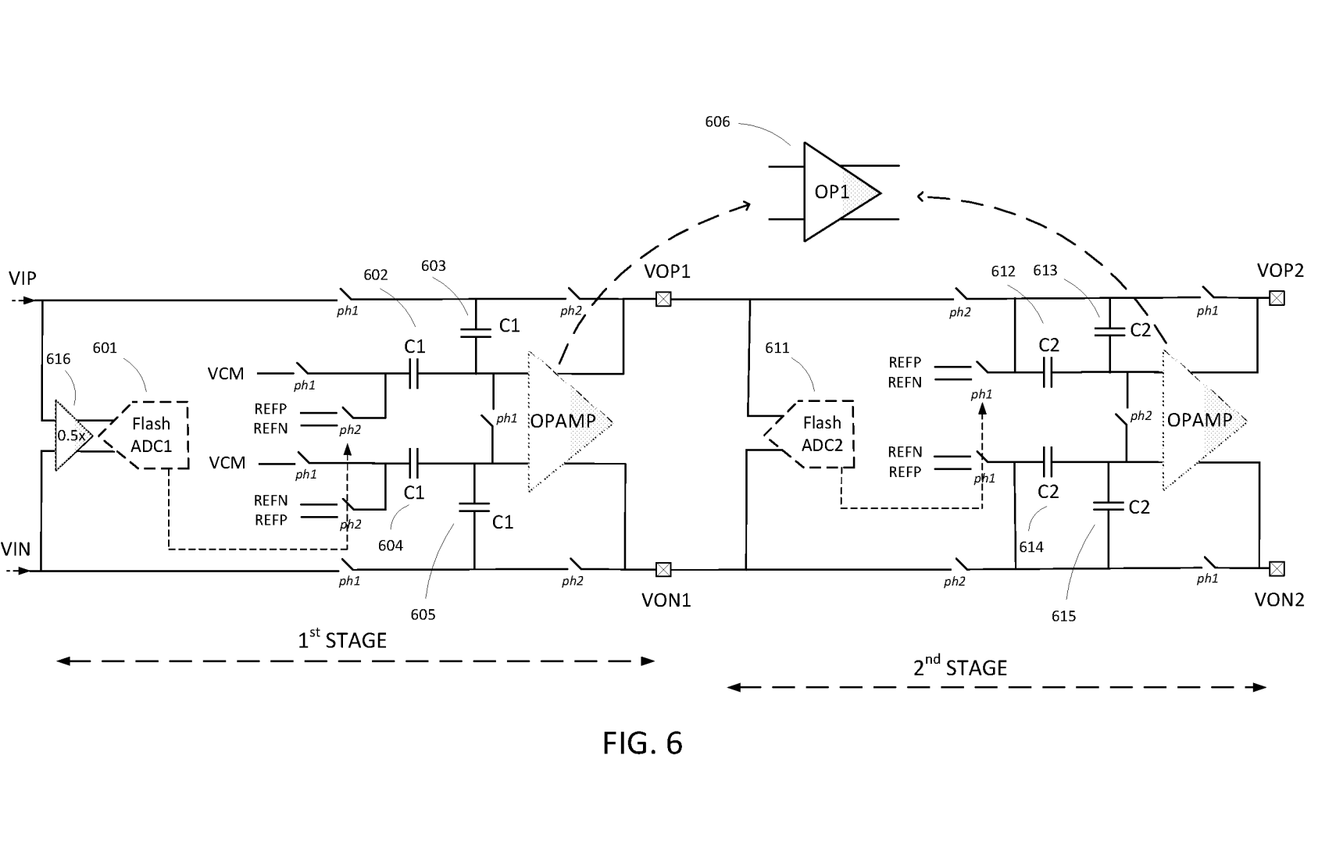
FIG. 6 presents the $1^{st}$ and $2^{nd}$ stage implementation of Programmable Gain Amplifier (PGA) embedded pipelined ADC using 1.5b/stage scheme.

FIG. 6 shows the invented implementation of Programmable Gain Amplifier (PGA) embedded pipelined ADC. It illustrates the detailed circuitry of the first two stages of pipelined ADC using 1.5b/stage scheme. Note that the scheme of 1.5b per stage is depicted here for simplicity reason, however the other schemes such as 3 bit per stage or 4 bit per stage also applies. The first stage on the left consists of flash ADC 601, four sampling capacitors 602-605, and associated switches. The signal inputs are VIP/VIN and reference inputs are REFP/REFN and common-mode voltage VCM, the outputs of $1^{st}$ stage are VOP1/VON1. The second stage consists of flash ADC 611, four sampling capacitors 612-615, and associated switches. The outputs of $2^{nd}$ stages are VOP2/VON2. The OPAMP in each stage is actually one shared OP1 606. This shared OPAMP OP1 saves power consumption by using one OPAMP for two consecutive stages. There are internal built-in switches inside of OP1 606 to decide which stage is connected and perform amplification function. The differential inputs VIP/VIN, first stage outputs VOP1/VON1 and second stage outputs VOP2/VON2 are connected and coupled through switches. The clock phases ph1 and ph2 indicates the clock phase that the switches are turned on. The reference switches can be connected to REFP or REFN voltage depending on the Flash ADC's output.

Figure 7:
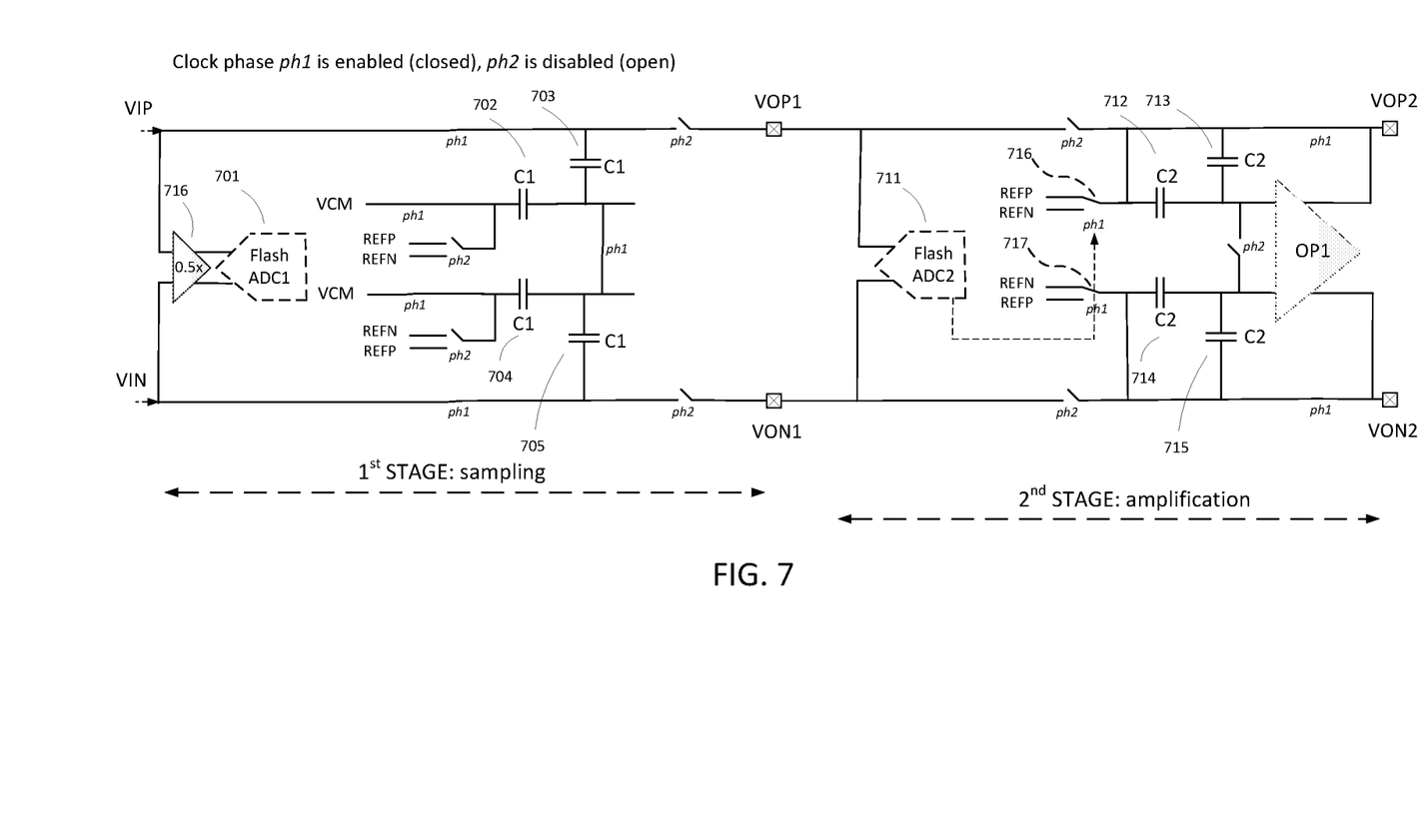
FIG. 7 shows the circuit operation of FIG. 6 during clock phase ph1 enabled.
Figure 8:
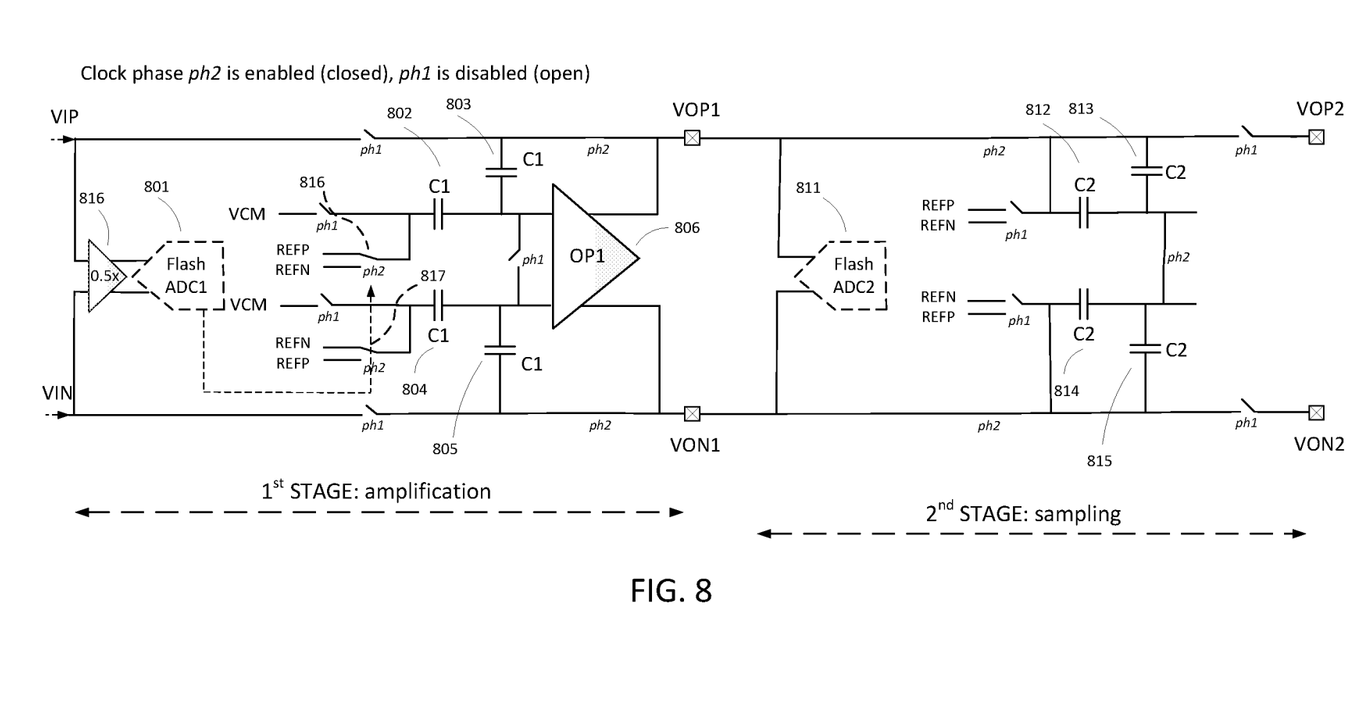
FIG. 8 shows the circuit operation of FIG. 6 during clock phase ph2 enabled.

FIG. 7 and FIG. 8 illustrate the operation of these two stages when clock phase ph1 and ph2 are enabled respectively. As shown in FIG. 7, first stage is performing sampling while the second stage is executing amplification when clock phase ph1 is enabled. Capacitor 703 and 705 are sampling the input voltages VIP/VIN. A gain stage 716 reduces the input amplitude by half before feeding inputs into Flash ADC1 701. The upper reference switch 716 and lower reference switch 717 are connected to REFP and REFN respectively given flash ADC2 output result. The internal switches inside of OP1 706 direct the OPAMP connection to the second stage, where the amplification function is executed through capacitor 712, 713, 714, 715 and OP1. The amplification gain is determined by the capacitor ratio of 713 and 712. In this exemplary case as 1.5b/stage scheme, capacitor 712 and 713 has the equal value. The total charge been sampled and stored by $1^{st}$ stage capacitor is expressed as:

$$Q=C1*(VIP-VIN)$$

Q is the total charge stored in the $1^{st}$ stage sampling capacitor
(VIP–VIN) is the difference voltage of inputs VIP, VIN
And the second stage output voltage is expressed as:

$$(VOP2-VON2)=2*(VOP1-VON2)+(REFP-REFN)$$

The gain of 2 in the equation above arises because the input is sampled by two capacitors 712 and 713 during sample phase but only one capacitor 713 is in the feedback loop of the amplifier during amplification phase.

FIG. 8 illustrates the circuitry of another phase where clock phase ph2 is enabled. First stage is performing amplification while the second stage is executing sampling function. The internal switches of OP1 806 direct the OPAMP connection to the first stage. The amplification is carried out through capacitors 802, 803, 804, 805 and OP1. The amplification gain is determined by the capacitor ratio of 802 and 803. In this exemplary case of 1.5b/stage scheme, capacitor 802 and 803 has the same value. For the $2^{nd}$ stage, both capacitors 812 and 813 samples the first stage output VOP1/VON. The total charge been sampled and stored by the $2^{nd}$ stage capacitor is expressed as:

$$Q=2*(C2)*(VOP1-VON1)$$

Q is the total charge stored in the $2^{nd}$ stage sampling capacitor
(VOP1–VON1) is the difference voltage of 1st stage outputs
And the first stage output voltage is expressed as:

$$(VOP1-VON1)=1*(VIP-VIN)+(REFP-REFN)$$

Note that the differences between the first stage and the second stage are:
(1) There is a 0.5 gain between 1st stage Flash ADC and the inputs.
(2) The capacitor C1 of $1^{st}$ stage samples VCM while the capacitor C2 of $2^{nd}$ stage samples inputs, where VCM is a common-mode voltage.

These differences leads to the different equations described above for $1^{st}$ stage and $2^{nd}$ stage with respect to sampling and amplification phase. In particular, the $1^{st}$ stage reduces the input range by adding a 0.5× gain 816 in FIG. 6 before the Flash ADC. And the sampling capacitor of $1^{st}$ stage is only half of $2^{nd}$ stage's sampling capacitor.

Figure 9:
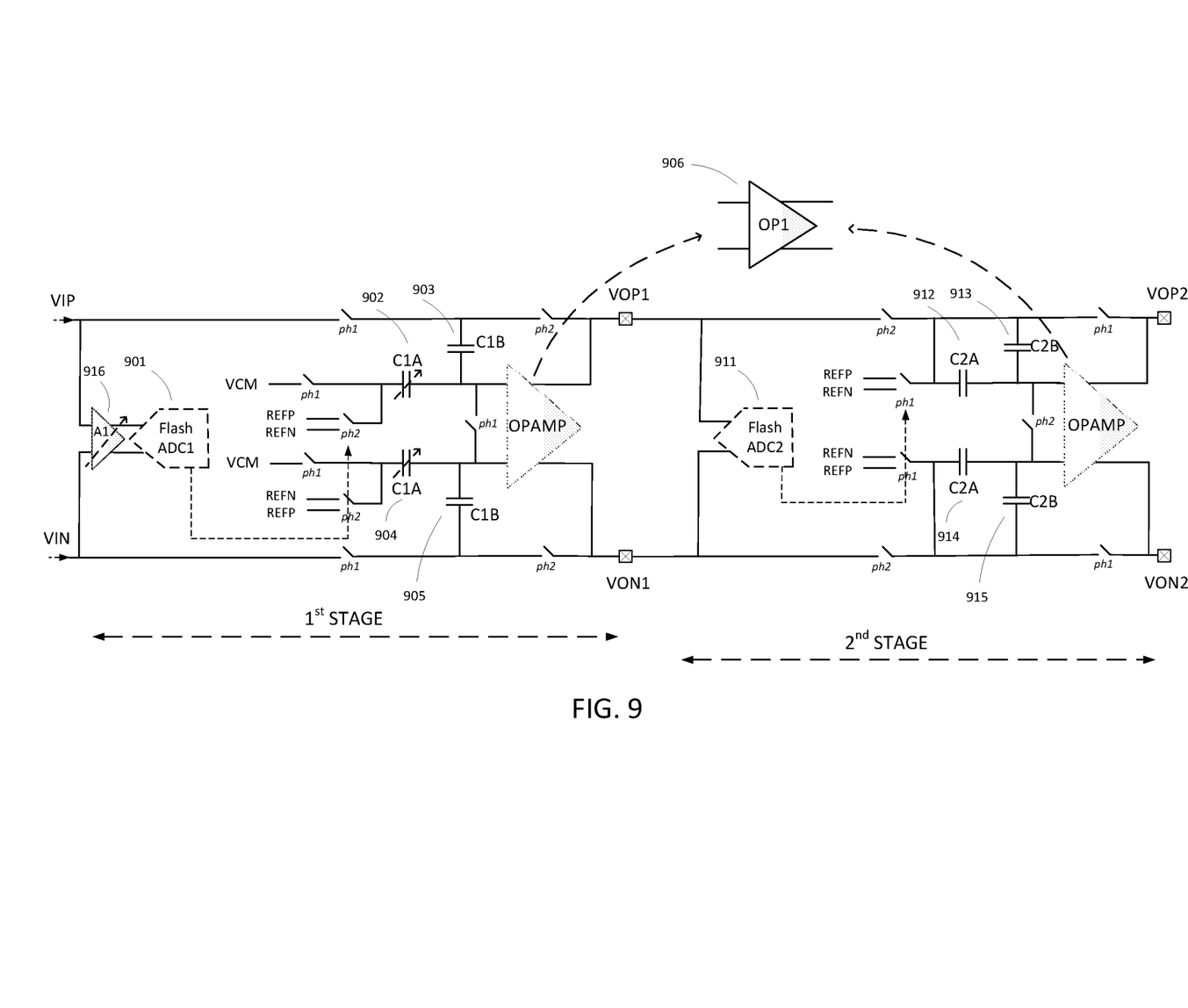
FIG. 9 is the proposed $1^{st}$ and $2^{nd}$ stage implementation of Programmable Gain Amplifier (PGA) embedded pipelined ADC in a general configuration.

The proposed Programmable Gain Amplifier (PGA) embedded pipelined ADC can be implemented using 1.5b/stage scheme as shown in FIG. 6, which demonstrates that input range is reduced by half. Moreover, this proposed method can be applied to other architectures like 3b/stage, 4b/stage etc. FIG. 9 shows a proposed Programmable Gain Amplifier (PGA) embedded pipelined ADC in a general configuration. Only the first stage and $2^{nd}$ stage circuitry are illustrated. It consists of Flash ADC 901, 911, sampling capacitors 902-905, 912-915 and one shared OPAMP OP1 906 and associated switches coupled together. The gain stage 916 comprises a gain value of A1 before sending input signal into Flash ADC 901. The sampling capacitors 902/904 and 903/905 can have different capacitance. The value of A1 and sampling capacitor values can be calculated depending on the how much input range reduction is required. The 1st stage output range is then expressed as:

$$(VOP1-VON1) = \frac{C1A}{C1B}(VIP-VIN) + \frac{C1A}{C1B}(REFP-REFN)$$

By incorporating a corresponding gain stage before $1^{st}$ stage Flash ADC, the intended reduction ratio of the input range can be specified and implemented accordingly.

Figure 10:
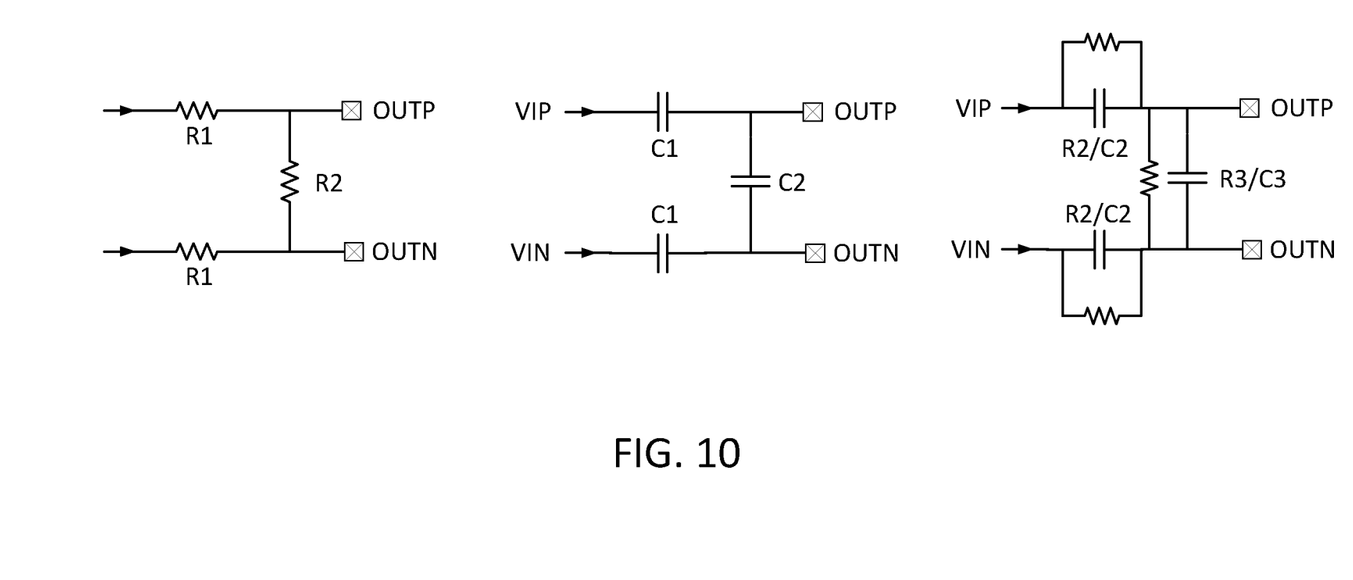
FIG. 10 illustrates the implementation of the gain stage before Flash ADC.
Figure 11:
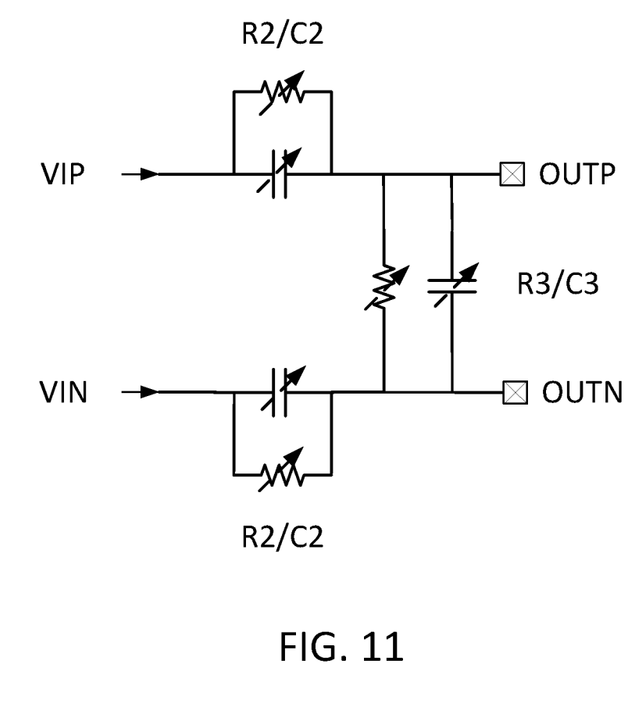
FIG. 11 illustrates the gain stage implementation using adjustable R/C banks.

FIG. 10 illustrates the implementation of gain stage in FIG. 9. The gain stage can be formed by resistor divider, capacitor divider or RC in parallel divider depending on the input signal characteristic. With increasing complexity of system-on-a-chip (SoC), there are numerous variables or parameters affecting the overall system performance. It is advantageous to have the programmability that can adjust the input range of ADC for obtaining the optimal system performance. FIG. 11 illustrates the gain stage implementation using adjustable resistor banks and adjustable capacitor banks. This enables users to fine-tune the input range of ADC on the fly to achieve favorable system performance.

Figure 12:
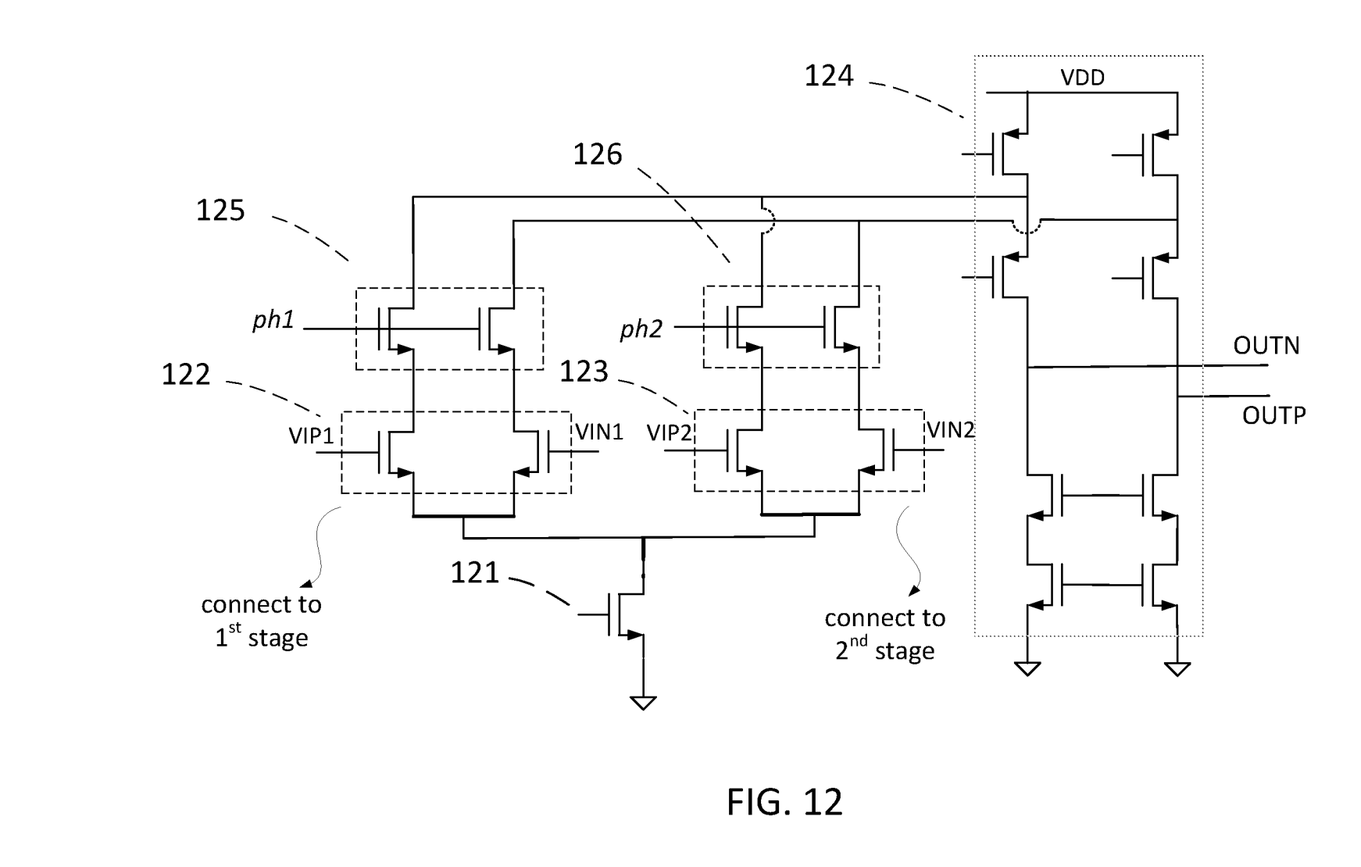
FIG. 12 shows the built-in switch implementation of shared OPAMP between two pipelined stages.

FIG. 12 illustrates the exemplary implementation of built-in switch of the shared OPAMP amplifier. The high gain amplifier consists of tail current 121, two differential input pairs 122, 123, folded-cascoded gain stage 124 and two sets of NMOS switches 125, 126. Two differential pairs 122, 123 are connected to $1^{st}$ stage and $2^{nd}$ stage in FIG. 6 respectively. Switches 125, 126 determine which differential pairs are enabled. The switches 125, 126 are arranged as common-gate configuration and the gates are controlled by different clock phase ph1/ph2. When $1^{st}$ stage is performing amplification, ph1 is enabled and differential pair 122 is enabled accordingly. Incorporating the switch on top of the differential pair minimizes the associated net impedance, which enables amplifier to achieve favorable settling behavior.

By employing a PGA embedded pipelined ADC, ADC can operate at lower power supply and take larger input range. The overall system performance can be optimized by adjusting the ADC input range without power consumption penalty.

What is claimed is:

1. A Programmable Gain Amplifier (PGA) embedded pipelined ADC with a wide input range, comprising:
   a configuration of a first stage and a second stage coupled together;
   a gain stage before the first stage Flash ADC;
   sampling capacitors in specific ratio;
   a shared op-amp between two stages; and
   multiple associated switches operating in two clock phases, wherein one op-amp amplifier is shared by two pipelined stages, the operating phase is determined by internal switches of the amplifier, wherein two differential input pairs couple to one tail current source and one folded cascoded gain stage in one of the first or the second stage, each differential pair is enabled at specific clock phase.

2. The PGA embedded pipelined ADC of claim 1, wherein one or more sampling capacitors are connected to a common-mode voltage and other sampling capacitors are connected to inputs signal.

3. The PGA embedded pipelined ADC of claim 1, wherein a ratio of sampling capacitors is programmable to adjust the input range for obtaining optimal ADC linearity performance.

4. The PGA embedded pipelined ADC of claim 1, wherein the gain stage before the first stage is programmed to adjust the input range for obtaining optimal ADC linearity performance.

5. The PGA embedded pipelined ADC of claim 1, wherein the gain stage comprises a resistor divider, capacitor divider or R/C in parallel divider.

6. The PGA embedded pipelined ADC of claim 1, wherein the gain stage comprises an adjustable resistor bank or adjustable capacitor bank to fine-tune the pipelined ADC input range on the fly for obtaining optimal system performance.

* * * * *